(12) United States Patent
Kuroyanagi

(10) Patent No.: US 9,831,850 B2
(45) Date of Patent: Nov. 28, 2017

(54) ACOUSTIC WAVE DEVICE WITH A PIEZOELECTRIC SUBSTRATE THAT IS NOT LOCATED IN SOME REGIONS

(71) Applicant: TAIYO YUDEN CO., LTD., Tokyo (JP)

(72) Inventor: Takuma Kuroyanagi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 2 days.

(21) Appl. No.: 14/949,535

(22) Filed: Nov. 23, 2015

(65) Prior Publication Data

US 2016/0248398 A1    Aug. 25, 2016

(30) Foreign Application Priority Data

Feb. 19, 2015 (JP) .................................. 2015-031084

(51) Int. Cl.
*H03H 9/10* (2006.01)
*H03H 9/25* (2006.01)
(Continued)

(52) U.S. Cl.
CPC ...... *H03H 9/1071* (2013.01); *H03H 9/02559* (2013.01); *H03H 9/02574* (2013.01);
(Continued)

(58) Field of Classification Search
CPC ........... H03H 9/02559; H03H 9/02574; H03H 9/02629; H03H 9/02834; H03H 9/02897;
(Continued)

(56) References Cited

U.S. PATENT DOCUMENTS 3,943,389 A * 3/1976 Hickernell ......... H03H 9/02834
310/313 A
5,998,907 A * 12/1999 Taguchi ............. H03H 9/02574
310/313 R
(Continued)

FOREIGN PATENT DOCUMENTS

JP    2004-304622 A    10/2004
JP    2005-109221 A     4/2005
(Continued)

OTHER PUBLICATIONS

English language machine translation of JP 2010-259011, dated Nov. 11, 2010, 8 pages.*
(Continued)

*Primary Examiner* — Barbara Summons
(74) *Attorney, Agent, or Firm* — Chen Yoshimura LLP

(57) ABSTRACT

An acoustic wave device includes: a support substrate; a piezoelectric substrate bonded to the support substrate; a first acoustic wave element formed on the piezoelectric substrate; a frame formed on the support substrate to surround the first acoustic wave element; and a substrate formed on the frame so that a cavity to which the first acoustic wave element is exposed is formed above the piezoelectric substrate, wherein a difference in linear expansion coefficient between the support substrate and the substrate in a first direction in a surface direction of the piezoelectric substrate is less than a difference in linear expansion coefficient between the support substrate and the piezoelectric substrate in the first direction, and the piezoelectric substrate remains in a region where the first acoustic wave element is formed and is removed in a region where the frame is formed.

14 Claims, 9 Drawing Sheets

(51) Int. Cl.
*H03H 9/64* (2006.01)
*H03H 9/02* (2006.01)
*H03H 9/00* (2006.01)

(52) U.S. Cl.
CPC .... *H03H 9/02834* (2013.01); *H03H 9/02897* (2013.01); *H03H 9/02992* (2013.01); *H03H 9/6483* (2013.01); *H03H 2009/0019* (2013.01)

(58) Field of Classification Search
CPC .. H03H 9/02992; H03H 9/058; H03H 9/0585; H03H 9/1071; H03H 9/64; H03H 9/6483; H03H 2009/0019; H03H 9/02543
USPC .......................................... 333/133, 193–196
See application file for complete search history.

(56) References Cited

U.S. PATENT DOCUMENTS

| | | | | |
|---|---|---|---|---|
| 6,996,882 B2* | 2/2006 | Onishi | ................. | H03H 9/0222 29/25.35 |
| 7,227,429 B2* | 6/2007 | Kawachi | ............. | H03H 9/0547 29/25.35 |
| 7,230,512 B1* | 6/2007 | Carpenter | ................ | H03H 3/08 333/133 |
| 7,331,092 B2* | 2/2008 | Miura | ...................... | H03H 3/08 204/192.18 |
| 7,800,464 B2* | 9/2010 | Tajima | ............... | H03H 9/02559 310/313 R |
| 8,258,895 B2* | 9/2012 | Ruile | ................... | H03H 9/0222 310/311 |
| 2004/0207485 A1 | 10/2004 | Kawachi et al. | | |
| 2005/0104204 A1 | 5/2005 | Kawakubo et al. | | |
| 2007/0115079 A1* | 5/2007 | Kubo | ................. | B81C 1/00238 333/189 |
| 2009/0224851 A1 | 9/2009 | Feiertag et al. | | |
| 2011/0146041 A1* | 6/2011 | Miyake | .................... | H03H 3/02 29/25.35 |
| 2013/0049889 A1* | 2/2013 | Shimizu | ................ | H03H 3/10 333/195 |

FOREIGN PATENT DOCUMENTS

| | | | |
|---|---|---|---|
| JP | 2005-348273 A | * | 12/2005 |
| JP | 2006-246112 A | | 9/2006 |
| JP | 2008-546207 A | | 12/2008 |
| JP | 2010-259011 A | * | 11/2010 |
| JP | 2014-033467 A | * | 2/2014 |

OTHER PUBLICATIONS

English language machine translation of JP 2005-348273, dated Dec. 15, 2005, 8 pages.*
English language machine translation of JP 2014-033467, dated Feb. 20, 2014, 5 pages.*

* cited by examiner

Comparative Example

Comparative Example

Comparative Example

ACOUSTIC WAVE DEVICE WITH A PIEZOELECTRIC SUBSTRATE THAT IS NOT LOCATED IN SOME REGIONS

CROSS-REFERENCE TO RELATED APPLICATION

This application is based upon and claims the benefit of priority of the prior Japanese Patent Application No. 2015-031084, filed on Feb. 19, 2015, the entire contents of which are incorporated herein by reference.

FIELD

A certain aspect of the present invention relates to an acoustic wave device.

BACKGROUND

As an acoustic wave device using an acoustic wave, there has been known devices in which a piezoelectric substrate including an acoustic wave element formed thereon is bonded to a substrate located so as to have a cavity above the acoustic wave element with a frame surrounding the acoustic wave element. In such acoustic wave devices, there has been known a device in which the material of the piezoelectric substrate differs from the material of the substrate as disclosed in Japanese Patent Application Publication No. 2004-304622 (Patent Document 1), and a device in which the material of the piezoelectric substrate is the same as that of the substrate as disclosed in Japanese Patent Application Publication No. 2006-246112 (Patent Document 2). Additionally, there has been known a device in which an acoustic wave element is also formed on the substrate as disclosed in Japanese Patent Application Publication No. 2008-546207 (Patent Document 3). Furthermore, there has been known a thin film device in which an element is formed on at least one of two substrates, and the two substrates are bonded to each other with a resin as disclosed in Japanese Patent Application Publication No. 2005-109221 (Patent Document 4).

When the material of the piezoelectric substrate differs from that of the substrate as disclosed in Patent Document 1, stress is generated by the difference of linear expansion coefficients, decreasing the reliability of the acoustic wave device. When the material of the piezoelectric substrate is the same as that of the substrate as disclosed in Patent Document 2, the stress is reduced. However, the material of the substrate needs to be the same as that of the piezoelectric substrate such as a lithium tantalate substrate or a lithium niobate substrate, and thus it is difficult to achieve sufficient strength. The reliability of the acoustic wave device thus decreases.

SUMMARY OF THE INVENTION

According to an aspect of the present invention, there is provided an acoustic wave device including: a support substrate; a piezoelectric substrate bonded to the support substrate; a first acoustic wave element formed on the piezoelectric substrate; a frame formed on the support substrate to surround the first acoustic wave element; and a substrate formed on the frame so that a cavity to which the first acoustic wave element is exposed is formed above the piezoelectric substrate, wherein a difference in linear expansion coefficient between the support substrate and the substrate in a first direction in a surface direction of the piezoelectric substrate is less than a difference in linear expansion coefficient between the support substrate and the piezoelectric substrate in the first direction, and the piezoelectric substrate remains in a region where the first acoustic wave element is formed and is removed in a region where the frame is formed.

DETAILED DESCRIPTION

Figure 1A:
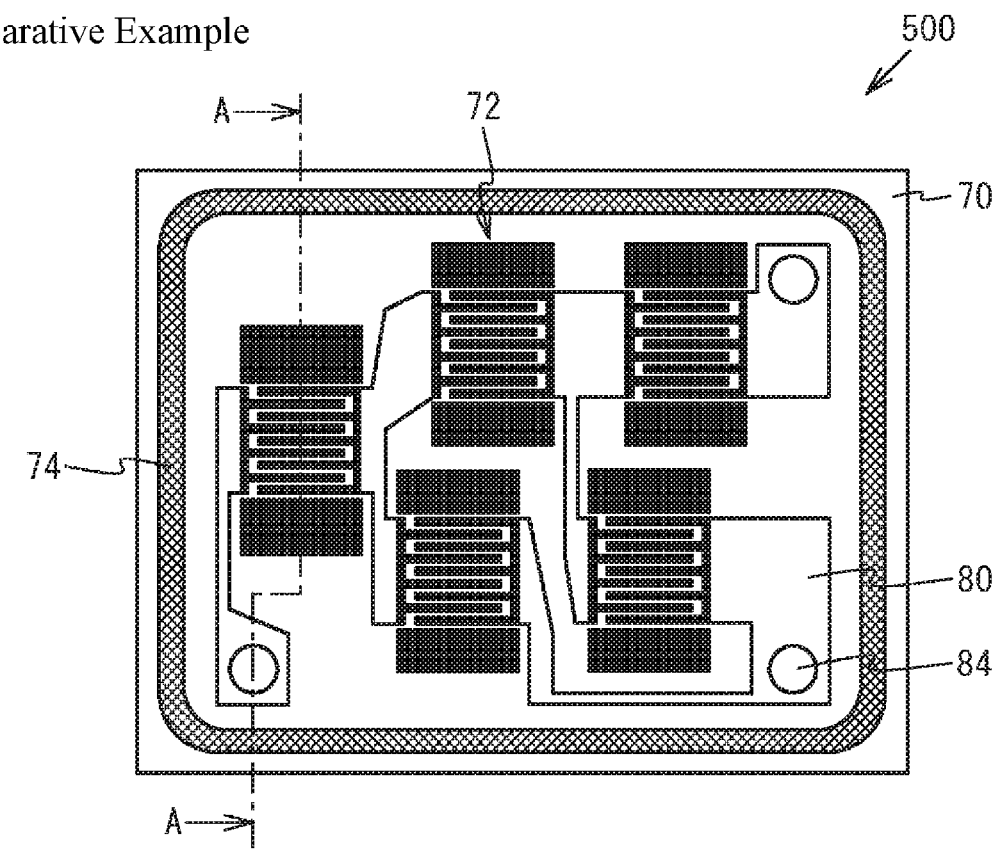
FIG. 1A is a plan view of an acoustic wave device in accordance with a first comparative example.
Figure 1B:
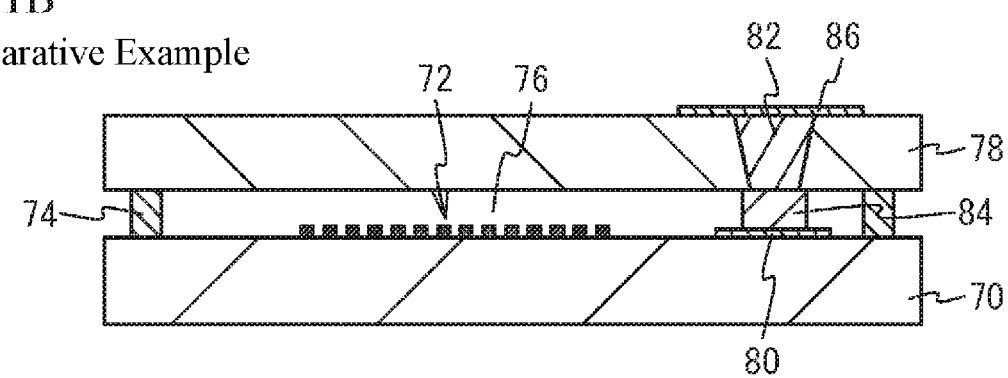
FIG. 1B is a cross-sectional view taken along line A-A in FIG. 1A.

A description will first be given of acoustic wave devices in accordance with comparative examples. FIG. 1A is a plan view of an acoustic wave device in accordance with a first comparative example, and FIG. 1B is a cross-sectional view taken along line A-A in FIG. 1A. FIG. 1A transparently illustrates a substrate 78 and the like. As illustrated in FIG. 1A and FIG. 1B, an acoustic wave device 500 of the first comparative example includes acoustic wave elements 72, each including an Interdigital Transducer (IDT) and reflectors, formed on a piezoelectric substrate 70. The piezoelectric substrate 70 is, for example, a lithium tantalate substrate (an LT substrate) or a lithium niobate substrate (an LN substrate).

On the piezoelectric substrate 70, formed is a frame 74 surrounding the acoustic wave elements 72. The substrate 78 is located on the frame 74 so that a cavity 76 is formed above the acoustic wave elements 72. The substrate 78 is made of a material different from that of the piezoelectric substrate 70, and is, for example, a sapphire substrate or a silicon substrate (a Si substrate).

On the piezoelectric substrate 70, formed are wiring lines 80 connecting to the acoustic wave elements 72. On the wiring line 80, formed is a protrusion electrode 84 connecting to a via wiring 82 that pierces through the substrate 78. On the via wiring 82, formed is a terminal 86 used for external connection.

In the first comparative example, the piezoelectric substrate 70 and the substrate 78 are bonded to each other via the frame 74. The piezoelectric substrate 70 and the substrate 78 are made of different materials, and thus have different linear expansion coefficients in the surface direction of the piezoelectric substrate 70. Accordingly, stress is generated by a change due to heat. For example, stress is generated by heat generated when the piezoelectric substrate 70 and the substrate 78 are bonded via the frame 74. Thus, the reliability of the acoustic wave device decreases.

A description will next be given of an acoustic wave device in accordance with a second comparative example. The acoustic wave device of the second comparative example is the same as the acoustic wave device of the first comparative example except that the substrate 78 and the piezoelectric substrate 70 are made of the same material, and thus the illustration is omitted. For example, when the piezoelectric substrate 70 is a LT substrate, the substrate 78 is a LT substrate. When the piezoelectric substrate 70 is a LN substrate, the substrate 78 is a LN substrate.

In the second comparative example, the piezoelectric substrate 70 and the substrate 78 are made of the same material, and thus stress is reduced. However, LT and LN have a relatively low hardness (sapphire has a Mohs hardness of 9, while LT has that of 5.5 and LN has that of 5), and a relatively small Young's modulus (sapphire has a Young's modulus of 470 GPa, while LT has that of 230 GPa and LN has that of 203 GPa). Thus, when the substrate 78 is a LT substrate or a LN substrate, it is difficult to achieve the sufficient strength, and the reliability of the acoustic wave device thus decreases.

Figure 2:
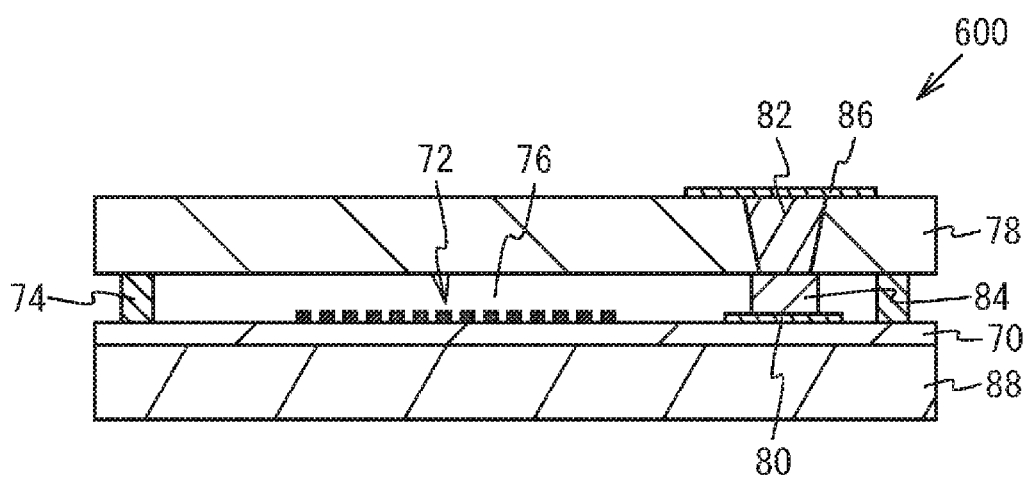
FIG. 2 is a cross-sectional view of an acoustic wave device in accordance with a third comparative example.

A description will next be given of an acoustic wave device in accordance with a third comparative example. FIG. 2 is a cross-sectional view of the acoustic wave device in accordance with the third comparative example. In an acoustic wave device 600 of the third comparative example, the piezoelectric substrate 70 is thinned and bonded to a support substrate 88 as illustrated in FIG. 2. The support substrate 88 is made of a material different from that of the piezoelectric substrate 70, and is, for example, a sapphire substrate or a Si substrate. The substrate 78 is made of the same material as the support substrate 88. For example, when the support substrate 88 is a sapphire substrate, the substrate 78 is a sapphire substrate. When the support substrate 88 is a Si substrate, the substrate 78 is a Si substrate. Other structures are the same as those of the first comparative example, and the description is thus omitted.

In the third comparative example, the piezoelectric substrate 70 (e.g., a LT substrate or a LN substrate) is bonded to the support substrate 88 (e.g., a sapphire substrate or a Si substrate). Sapphire and Si have linear expansion coefficients less than those of LT and LN, thus improving the temperature characteristics of the acoustic wave device. On the other hand, since the piezoelectric substrate 70 is bonded to the support substrate 88 made of the same material as the substrate 78, stress is slightly reduced but is still large. Therefore, the reliability of the acoustic wave device decreases.

Hereinafter, a description will be given of embodiments capable of improving the reliability of the acoustic wave device.

First Embodiment

Figure 3A:
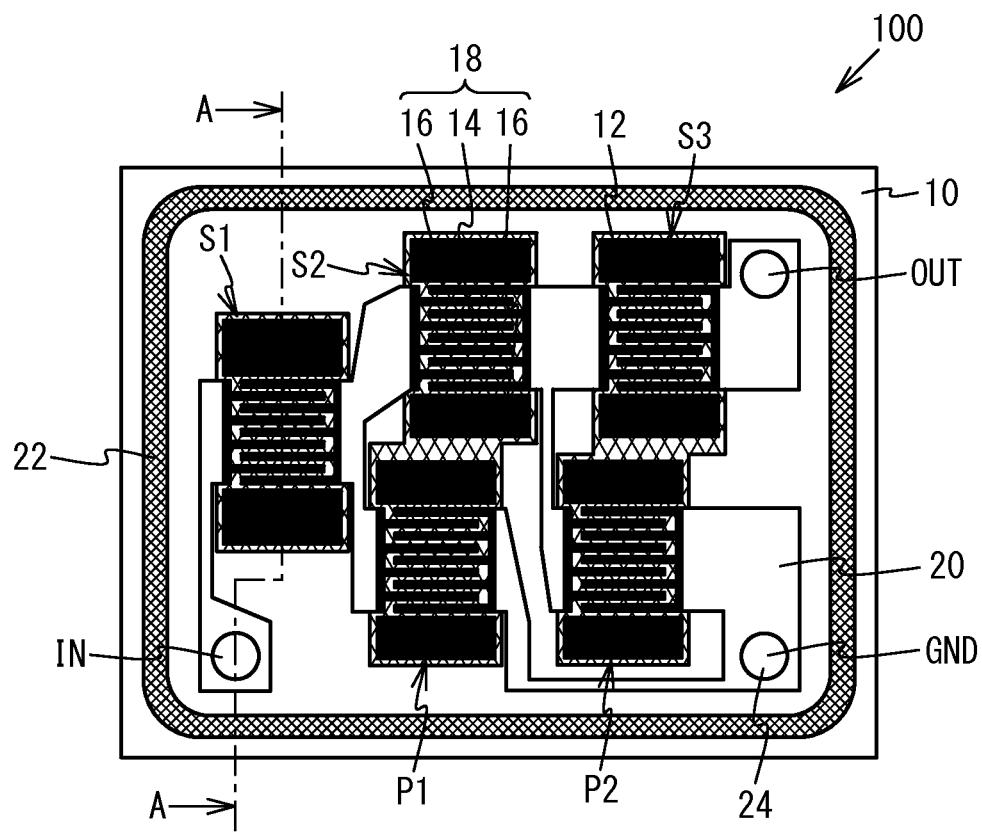
FIG. 3A is a plan view of an acoustic wave device in accordance with a first embodiment.
Figure 3B:
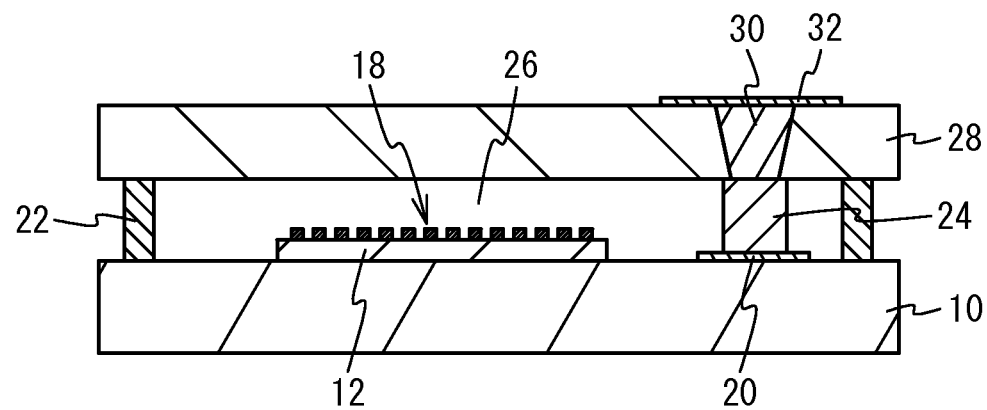
FIG. 3B is a cross-sectional view taken along line A-A in FIG. 3A.

FIG. 3A is a plan view of an acoustic wave device in accordance with a first embodiment, and FIG. 3B is a cross-sectional view taken along line A-A in FIG. 3A. FIG. 3A transparently illustrates a substrate 28 and the like. As illustrated in FIG. 3A and FIG. 3B, in an acoustic wave device 100 of the first embodiment, a piezoelectric substrate 12 is bonded to a support substrate 10. The support substrate 10 is made of a material different from that of the piezoelectric substrate 12. The support substrate 10 is, for example, a sapphire substrate. The piezoelectric substrate 12 is, for example, a 42° rotated Y-cut X-propagation LT substrate. The support substrate 10 has a thickness of, for example, 50 to 150 µm, and the piezoelectric substrate 12 has a thickness of, for example, 40 µm or less.

On the upper surface of the piezoelectric substrate 12, formed are Interdigital Transducers (IDTs) 14 and reflectors 16. The IDT 14 excites an acoustic wave in the piezoelectric substrate 12 or on the surface of the piezoelectric substrate 12. The reflector 16 reflects the acoustic wave. The IDT 14 and the reflectors 16 form an acoustic wave element 18 such as a resonator. The IDT 14 and the reflectors 16 are made of a metal film such as an aluminum film, a copper film, or an aluminum film to which copper is added.

On the support substrate 10, formed are wiring lines 20 and a frame 22. The wiring lines 20 electrically interconnect the acoustic wave elements 18, and/or electrically connect the acoustic wave elements 18 to protrusion electrodes 24. The protrusion electrode 24 is formed on the wiring line 20, and is electrically connected to a via wiring 30 piercing through the substrate 28. The frame 22 is formed to surround the acoustic wave elements 18. The wiring line 20 is made of a metal film formed by stacking, for example, a titanium film and a gold film in this order from the bottom. The frame 22 is made of a metal film formed by stacking, for example, a titanium film, a gold film, solder, and a copper film in this order from the bottom. The protrusion electrode 24 is made of a metal film formed by stacking, for example, solder and a copper film in this order from the bottom.

The piezoelectric substrate 12 remains in the regions where the acoustic wave elements 18 are formed, but is removed in other regions. Thus, in the regions where the wiring lines 20 and the frame 22 are formed, the piezoelectric substrate 12 is removed so that the support substrate 10 is exposed. That is to say, the piezoelectric substrate 12 is not formed between the wiring line 20 and the support substrate 10, or between the frame 22 and the support substrate 10. When the manufacturing error or the manufacturing margin is considered, the piezoelectric substrate 12 is preferably several to ten micrometers wider than the region where the acoustic wave element 18 is formed.

The substrate 28 is located on the frame 22 so that a cavity 26 to which the acoustic wave elements 18 are exposed is formed above the piezoelectric substrate 12. This structure hermetically seals the acoustic wave elements 18. As the acoustic wave element 18 is exposed to the cavity 26, the disturbance of the vibration of the IDT 14 in the acoustic wave element 18 is reduced. The substrate 28 is made of a material same as, for example, that of the support substrate 10, and is a sapphire substrate. The distance between the upper surface of the support substrate 10 and the lower surface of the substrate 28 is, for example, 10~50 µm. The substrate 28 has a thickness of, for example, 50~100 µm. A terminal 32 for external connection is formed on the via wiring 30 piercing through the substrate 28. The via wiring 30 is formed of a metal film such as a gold film or a copper film. The terminal 32 is formed of a metal film formed by stacking, for example, a copper film, a nickel film, and a gold film in this order from the bottom.

Here, a description will be given of a relation of linear expansion coefficients between the support substrate 10 and the piezoelectric substrate 12. As described above, the support substrate 10 and the substrate 28 are, for example, sapphire substrates, and the piezoelectric substrate 12 is, for example, a 42° rotated Y-cut X-propagation LT substrate. The linear expansion coefficient of the 42° rotated Y-cut X-propagation LT substrate greatly varies in the surface direction, and the linear expansion coefficient in the propagation direction of the acoustic wave (i.e., the X-axis orientation) is 16.1 ppm/° C., and the linear expansion coefficient in a perpendicular direction to the propagation direction of the acoustic wave is 9.5 ppm/° C. On the other hand, the sapphire substrate has a linear expansion coefficient of approximately 7 ppm/° C. in the surface direction. As understood from the above facts, among the linear expansion coefficients of the support substrate 10, the piezoelectric substrate 12, and the substrate 28, the difference in linear expansion coefficient between the support substrate 10 and the substrate 28 in a first direction in the surface direction of the piezoelectric substrate 12 is less than the difference in linear expansion coefficient between the support substrate 10 and the piezoelectric substrate 12 in the first direction. For example, the difference in linear expansion coefficient between the support substrate 10 and the substrate 28 in the propagation direction of the acoustic wave (7−7=0 ppm/° C.) is less than the difference in linear expansion coefficient between the support substrate 10 and the piezoelectric substrate 12 in the propagation direction of the acoustic wave (16.1−7=9.1 ppm/° C.).

As illustrated in FIG. 3A, the acoustic wave elements 18 formed on the piezoelectric substrate 12 form series resonators S1 through S3 and parallel resonators P1, P2. One or more series resonators S1 through S3 are connected in series between an input terminal IN and an output terminal OUT through the wiring lines 20. One or more parallel resonators P1 and P2 are connected in parallel between the input terminal IN and the output terminal OUT through the wiring lines 20. The parallel resonators P1 and P2 are electrically connected to a ground terminal GND through the wiring line 20.

Figure 4A:
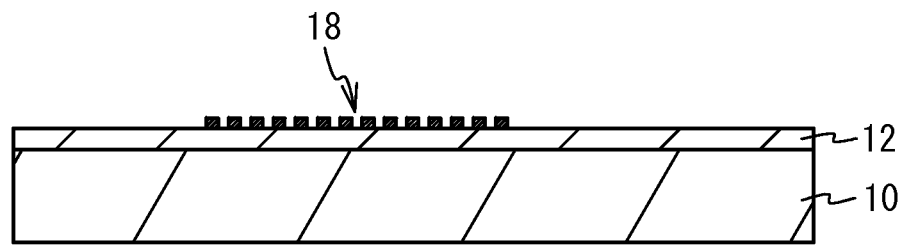
FIG. 4A through FIG. 4C are cross-sectional views (No. 1) illustrating a method of fabricating the acoustic wave device of the first embodiment.
Figure 4B:
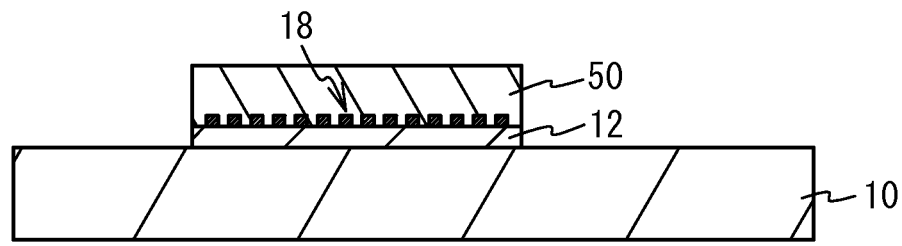
Figure 4C:
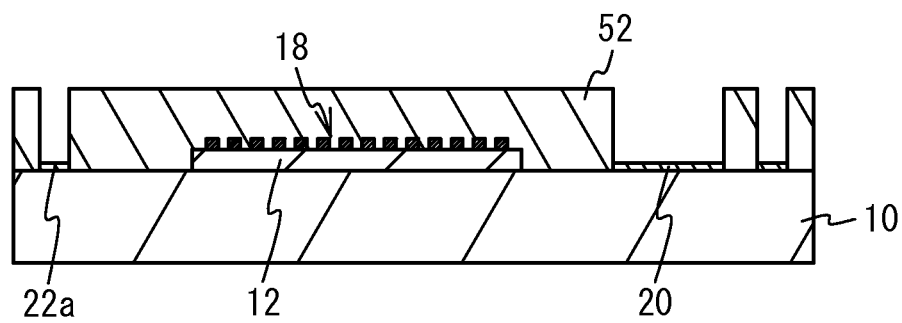
Figure 5A:
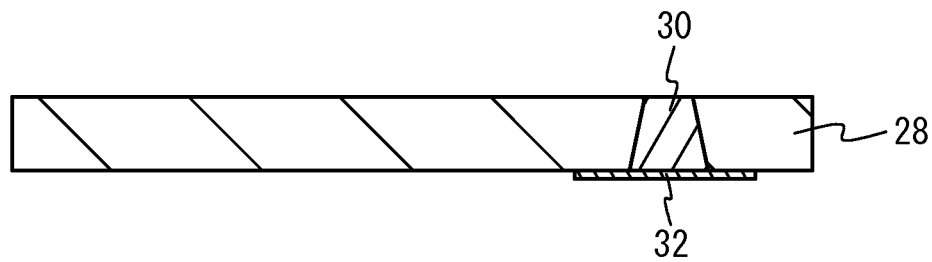
FIG. 5A through FIG. 5C are cross-sectional views (No. 2) illustrating a method of fabricating the acoustic wave device of the first embodiment.
Figure 5B:
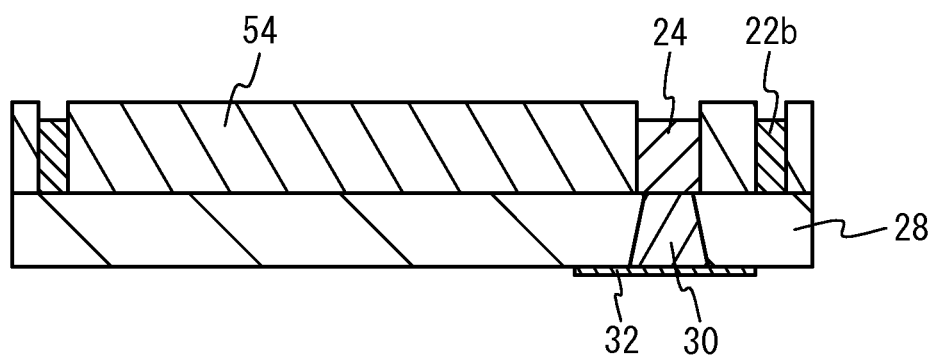
Figure 5C:
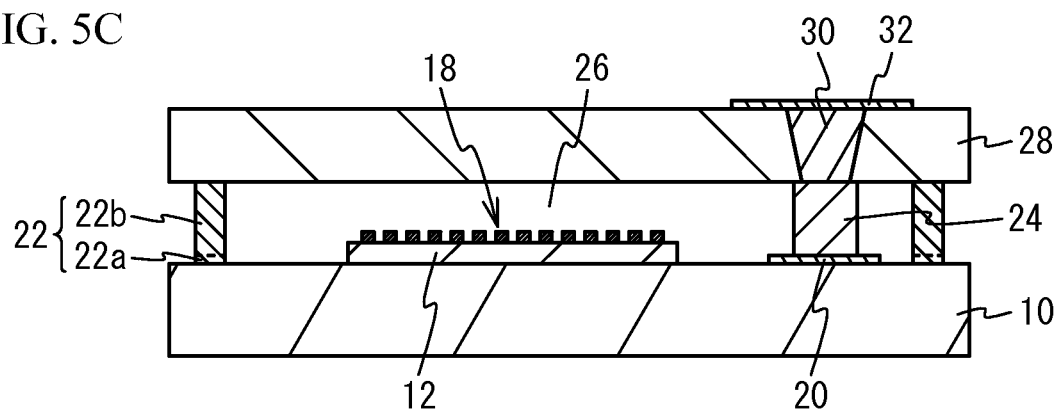

FIG. 4A through FIG. 5C are cross-sectional views illustrating a method of fabricating the acoustic wave device of the first embodiment. FIG. 4A through FIG. 4C are cross-sectional views illustrating a method of fabricating the support substrate 10 and the like, FIG. 5A and FIG. 5B are cross-sectional views illustrating a method of fabricating the substrate 28 and the like, and FIG. 5C is a cross-sectional view illustrating a step of bonding the support substrate 10 and the substrate 28. The fabrication process illustrated in FIG. 4A through FIG. 4C and the fabrication process illustrated in FIG. 5A and FIG. 5B are separately (e.g., concurrently) conducted.

A description will be given of the method of fabricating the support substrate 10 and the like. As illustrated in FIG. 4A, the piezoelectric substrate 12 is bonded onto the upper surface of the support substrate 10. The support substrate 10 is bonded to the piezoelectric substrate 12 by, for example, activating surfaces and then bonding them at room temperature. Then, the IDTs 14 and the reflectors 16 made of a metal film are formed on the piezoelectric substrate 12 to form the acoustic wave elements 18. The metal film may be formed by sputtering or evaporation, and a pattern may be formed by etching or liftoff.

As illustrated in FIG. 4B, a mask layer 50 is formed on the piezoelectric substrate 12. The mask layer 50 is, for example, a photoresist. The mask layer 50 on the acoustic wave elements 18 remains, and openings of the mask layer 50 are formed in other regions. The piezoelectric substrate 12 is removed by using the mask layer 50 as a mask. The piezoelectric substrate 12 may be removed by etching or blast. This process removes the piezoelectric substrate 12 in a region other than the regions where the acoustic wave elements 18 are formed, and allows the support substrate 10 to be exposed.

As illustrated in FIG. 4C, the mask layer 50 is removed. Then, a mask layer 52 is formed on the support substrate 10. The mask layer 52 is, for example, a photoresist. Openings of the mask layer 52 are formed in the regions where the wiring lines 20 and the frame 22 are to be formed, and the mask layer 52 remains in other regions. The wiring lines 20 and a lower layer 22a of the frame 22 made of a metal film are formed on the support substrate 10 by using the mask layer 52 as a mask. The metal film may be formed by sputtering, evaporation, or plating. After the metal film is formed, the mask layer 52 is removed.

A description will next be given of the method of fabricating the substrate 28 and the like. As illustrated in FIG. 5A, the via wirings 30 piercing through the substrate 28 and the terminals 32 connected to the via wirings 30 are formed. The via wiring 30 can be formed by forming a hole piercing through the substrate 28 and then embedding a metal film in the hole. The terminal 32 can be formed by forming a metal film by sputtering or evaporation and then forming a pattern by etching or liftoff.

As illustrated in FIG. 5B, a mask layer 54 is formed on a surface on the opposite side of the substrate 28 from the terminal 32. The mask layer 54 is, for example, a photoresist. Openings of the mask layer 54 are formed in the regions where the frame 22 and the protrusion electrodes 24 are to be formed, and the mask layer 54 remains in other regions. An upper layer 22b of the frame 22 and the protrusion electrodes 24 made of a metal film are formed on the substrate 28 by using the mask layer 54 as a mask. The metal film may be formed by sputtering, evaporation, or plating. After the metal film is formed, the mask layer 54 is removed.

After the fabrication processes illustrated in FIG. 4A through FIG. 5B, the upper layer 22b of the frame 22 formed on the substrate 28 is bonded to the lower layer 22a of the frame 22 formed on the support substrate 10 as illustrated in FIG. 5C. This process forms the cavity 26 above the acoustic wave elements 18 and hermetically seals the acoustic wave elements 18. Additionally, the protrusion electrodes 24 are bonded to the wiring lines 20. The above described process completes the acoustic wave device of the first embodiment.

According to the first embodiment, among the linear expansion coefficients of the support substrate 10, the piezoelectric substrate 12, and the substrate 28, the difference in linear expansion coefficient between the support substrate 10 and the substrate 28 in a first direction in the surface direction of the piezoelectric substrate 12 is less than the difference in linear expansion coefficient between the support substrate 10 and the piezoelectric substrate 12 in the first direction. As illustrated in FIG. 3A and FIG. 3B, the piezoelectric substrate 12 bonded to the support substrate 10 remains in the regions where the acoustic wave elements 18 are formed, and is removed in the region where the frame 22 is formed. This structure allows the frame 22 to be bonded to the support substrate 10 and the substrate 28 between which the difference in linear expansion coefficient is relatively small. Accordingly, stress is reduced. Additionally, the substrate 28 and the piezoelectric substrate 12 are made of different materials, and thus the substrate 28 can have sufficient strength. Therefore, good reliability can be achieved.

The first embodiment describes, as an example, a case where the piezoelectric substrate 12 is a 42° rotated Y-cut X-propagation LT substrate, but does not intend to suggest any limitation. The piezoelectric substrate 12 may be a LT substrate or a LN substrate having another cut angle and another propagation direction, or a piezoelectric substrate other than the LT substrate and the LN substrate. For example, the piezoelectric substrate 12 may be a 36°~46° rotated Y-cut X-propagation LT substrate.

Table 1 lists examples of the piezoelectric substrate 12, and a linear expansion coefficient in the propagation direction of the acoustic wave and a linear expansion coefficient in a perpendicular direction to the propagation direction of the acoustic wave in the surface direction of each example.

TABLE 1

|  | PROPAGATION DIRECTION [ppm/° C.] | PERPENDICULAR DIRECTION TO PROPAGATION DIRECTION [ppm/° C.] |
|---|---|---|
| 42° rotated Y-cut X-propagation LT substrate | 16.1 | 9.5 |
| 36° rotated Y-cut X-propagation LT substrate | 16.1 | 8.2 |
| X-cut 112° rotated Y-propagation LT substrate | 5.8 | 14.4 |
| 64° rotated Y-cut X-propagation LN substrate | 15.4 | 13.9 |
| 128° rotated Y-cut X-propagation LN substrate | 15.4 | 12.4 |
| Y-cut Z-propagation LN substrate | 17.5 | 15.4 |

As is clear from Table 1, when the piezoelectric substrate 12 is a rotated Y-cut X-propagation LT substrate or a rotated Y-cut X-propagation LN substrate, the linear expansion coefficient in the propagation direction of the acoustic wave (i.e., the X-axis orientation) is large. Thus, when the piezoelectric substrate 12 is a rotated Y-cut X-propagation LT substrate or a rotated Y-cut X-propagation LN substrate, the difference in linear expansion coefficient between the support substrate 10 and the substrate 28 in the propagation direction of the acoustic wave (X-axis orientation) is required to be less than the difference in linear expansion coefficient between the support substrate 10 and the piezoelectric substrate 12 in the propagation direction. That is to say, the difference in linear expansion coefficient between the support substrate 10 and the substrate 28 in a direction in which the linear expansion coefficient of the piezoelectric substrate 12 is largest is required to be less than the difference in linear expansion coefficient between the support substrate 10 and the piezoelectric substrate 12 in this direction. In other words, the difference in linear expansion coefficient between the support substrate 10 and the substrate 28 in a direction in which the difference in linear expansion coefficient between the support substrate 10 and the piezoelectric substrate 12 is largest is required to be less than the difference in linear expansion coefficient between the support substrate 10 and the piezoelectric substrate 12 in this direction.

According to Table 1, the rotated Y-cut X-propagation LT substrate and the rotated Y-cut X-propagation LN substrate have relatively small linear expansion coefficients in a direction perpendicular to the propagation direction of the acoustic wave. Thus, when the piezoelectric substrate 12 is a rotated Y-cut X-propagation LT substrate or a rotated Y-cut X-propagation LN substrate, the difference in linear expansion coefficient between the support substrate 10 and the substrate 28 in a perpendicular direction to the propagation direction of the acoustic wave is preferably less than the difference in linear expansion coefficient between the support substrate 10 and the piezoelectric substrate 12 in this perpendicular direction. This configuration allows the linear expansion coefficient of the support substrate 10 to be close to the linear expansion coefficient of the substrate 28.

Moreover, according to Table 1, an X-cut rotated Y-propagation LT substrate has a large linear expansion coefficient in a direction perpendicular to the propagation direction of the acoustic wave, and has a relatively small linear expansion coefficient in the propagation direction of the acoustic wave. Therefore, when the piezoelectric substrate 12 is an X-cut rotated Y-propagation LT substrate, the difference in linear expansion coefficient between the support substrate 10 and the substrate 28 in a perpendicular direction to the propagation direction of the acoustic wave is required to be less than the difference in linear expansion coefficient between the support substrate 10 and the piezoelectric substrate 12 in the perpendicular direction. The difference in linear expansion coefficient between the support substrate 10 and the substrate 28 in the propagation direction of the acoustic wave is preferably less than the difference in linear expansion coefficient between the support substrate 10 and the piezoelectric substrate 12 in the propagation direction.

Moreover, according to Table 1, a Y-cut Z-propagation LN substrate has a large linear expansion coefficient in the propagation direction of the acoustic wave, and has a relatively small linear expansion coefficient in a direction perpendicular to the propagation direction of the acoustic wave. Thus, when the piezoelectric substrate 12 is a Y-cut Z-propagation LN substrate, the difference in linear expansion coefficient between the support substrate 10 and the substrate 28 in the propagation direction of the acoustic wave is required to be less than the difference in linear expansion coefficient between the support substrate 10 and the piezoelectric substrate 12 in the propagation direction. The difference in linear expansion coefficient between the support substrate 10 and the substrate 28 in a perpendicular direction to the propagation direction of the acoustic wave is preferably less than the difference in linear expansion coefficient between the support substrate 10 and the piezoelectric substrate 12 in the perpendicular direction.

Additionally, according to the first embodiment, as illustrated in FIG. 3A and FIG. 3B, the piezoelectric substrate 12 is removed in the regions where the protrusion electrodes 24 are formed. This structure allows the protrusion electrodes 24 to be bonded to the support substrate 10 and the substrate 28 between which the difference in linear expansion coefficient is relatively small, thereby reducing the stress.

Moreover, according to the first embodiment, the support substrate 10 and the substrate 28 are made of the same material, and the stress is thereby further reduced. The first embodiment describes, as an example, a case where both the support substrate 10 and the substrate 28 are sapphire substrates, but both of them may be other substrates such as Si substrates (linear expansion coefficient: 3.4 ppm/° C.).

Moreover, according to the first embodiment, the frame 22 contains a material (e.g., titanium with a linear expansion coefficient of 8.6 ppm/° C.) having a linear expansion coefficient of which a difference from the linear expansion coefficient of the support substrate 10 in the propagation direction of the acoustic wave is less than the difference in linear expansion coefficient between the support substrate 10 and the piezoelectric substrate 12 in the propagation direction. This configuration allows the linear expansion coefficient of the frame 22 to be close to the linear expansion coefficient of the support substrate 10, and prevents the stress from increasing. To reduce the stress, the above material contained in the frame 22 is preferably formed to make contact with at least one of the support substrate 10 and the substrate 28. In addition, when the support substrate 10 is a Si substrate, the frame 22 preferably contains tungsten (linear expansion coefficient: 4 ppm/° C.) or molybdenum (linear expansion coefficient: 5 ppm/° C.) as the above described material. In addition, the frame 22 may contain an FeNi-based alloy (linear expansion coefficient: 0.5~15 ppm/° C.) as the above described material.

According to the first embodiment, the frame 22 is made of a metal film, and thus the hermetic of the acoustic wave element 18 is improved compared to a case where the frame 22 is made of a resin film. In addition, as the piezoelectric substrate 12 is bonded to the support substrate 10 having a smaller linear expansion coefficient than the piezoelectric substrate 12, the temperature characteristics of the acoustic wave element 18 are improved.

In the first embodiment, the wiring line 20 is formed to cross the level difference at the edge of the piezoelectric substrate 12. Thus, to prevent the breaking of the wiring line 20, the edge of the piezoelectric substrate 12 may be formed to slant. When the edge of the piezoelectric substrate 12 is formed not to slant, the breaking of the wiring line 20 may be prevented by adjusting the thickness of the wiring line 20.

The first embodiment describes the surface acoustic wave device as an example of an acoustic wave device, but the acoustic wave device may be a boundary acoustic wave device or a Love wave device.

Figure 6A:
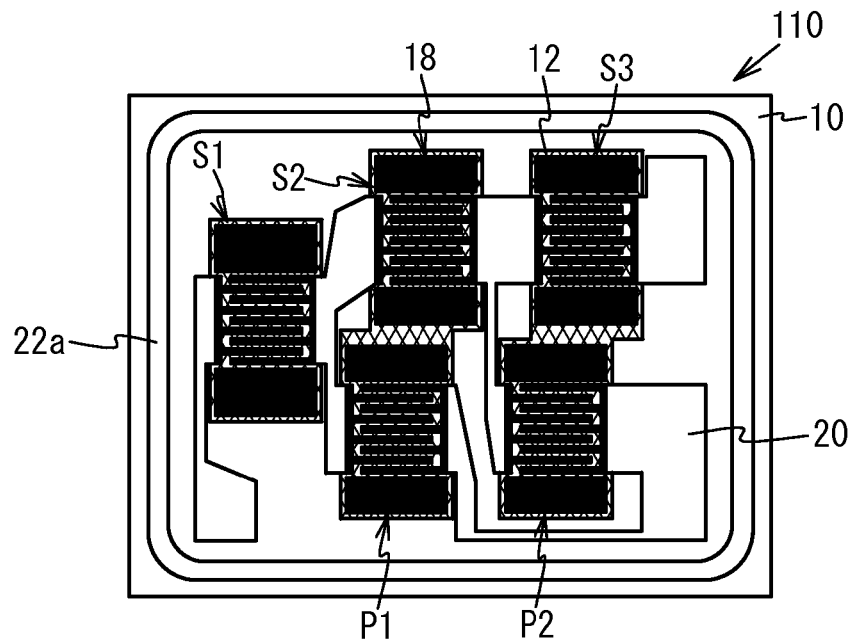
FIG. 6A and FIG. 6B are plan views of an acoustic wave device in accordance with a first variation of the first embodiment.
Figure 6B:
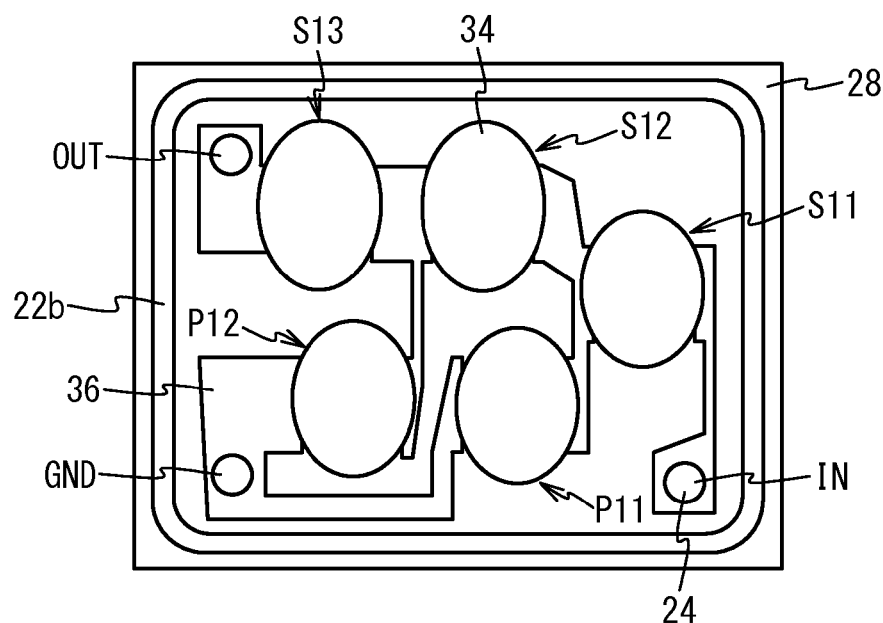
Figure 6C:
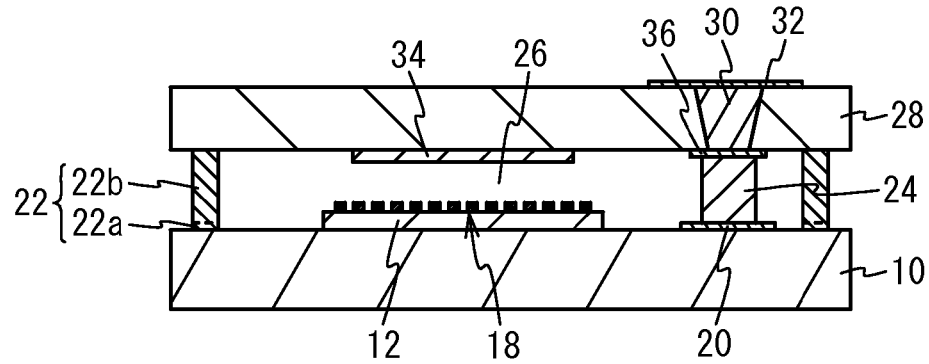
FIG. 6C is a cross-sectional view of the acoustic wave device of the first variation of the first embodiment.

FIG. 6A and FIG. 6B are plan views of an acoustic wave device in accordance with a first variation of the first embodiment, and FIG. 6C is a cross-sectional view of the acoustic wave device of the first variation of the first embodiment. As illustrated in FIG. 6A through FIG. 6C, an acoustic wave device 110 of the first variation of the first embodiment includes acoustic wave elements 34 made of piezoelectric thin film resonators and wiring lines 36 formed on the lower surface of the substrate 28. The acoustic wave elements 34 form series resonators S11 through S13 and parallel resonators P11, P12. One or more series resonators S11 through S13 are connected in series between the input terminal IN and the output terminal OUT through the wiring lines 36. One or more parallel resonators P11 and P12 are connected in parallel between the input terminal IN and the output terminal OUT through the wiring lines 36. The parallel resonators P11 and P12 are connected to the ground terminal GND through the wiring line 36. Other configurations are the same as those of the first embodiment, and the description is thus omitted.

As described in the first variation of the first embodiment, the acoustic wave elements 34 may be formed under the substrate 28 to be exposed to the cavity 26. This structure enables to obtain a small acoustic wave device including multiple filters. For example, one of a filter composed of the acoustic wave elements 18 and a filter composed of the acoustic wave elements 34 may be used as a transmit filter, and the other is used as a receive filter to form a duplexer.

Figure 7A:
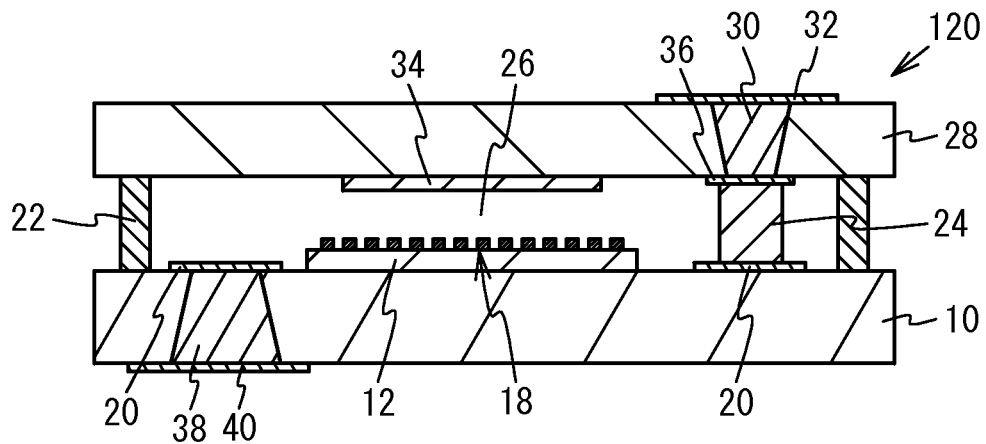
FIG. 7A through FIG. 7C are cross-sectional views of acoustic wave devices in accordance with second through fourth variations of the first embodiment, respectively.
Figure 7B:
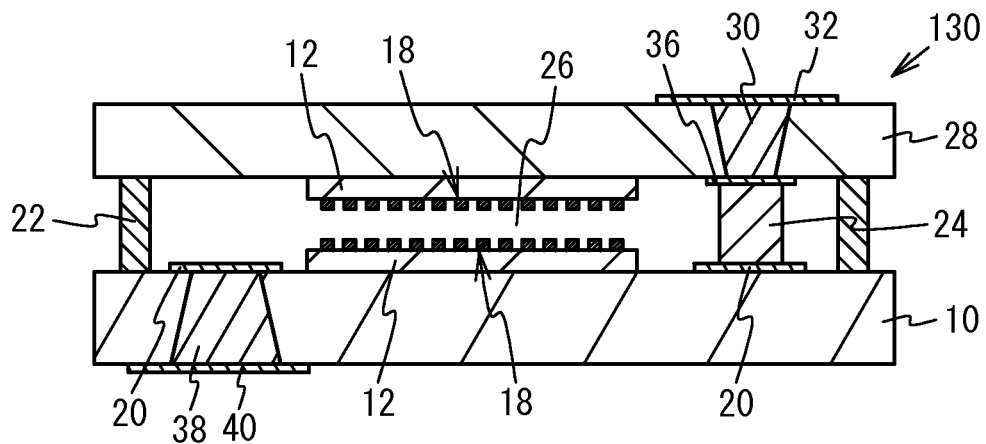
Figure 7C:
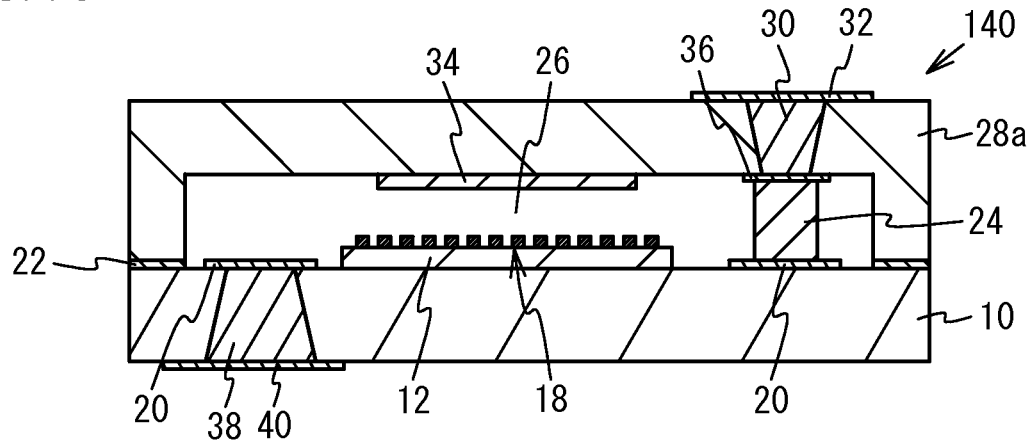

FIG. 7A through FIG. 7C are cross-sectional views of acoustic wave devices in accordance with second through fourth variations of the first embodiment, respectively. As illustrated in FIG. 7A, an acoustic wave device 120 of the second variation of the first embodiment includes a via wiring 38 that pierces through the support substrate 10 and is electrically connected to the wiring line 20 of the support substrate 10. Under the via wiring 38, a terminal 40 for external connection is formed. Other structures are the same as those of the first variation of the first embodiment, and thus the description is omitted. As described in the second variation of the first embodiment, the via wiring 38 and the terminal 40 may be formed on the support substrate 10 to allow for external connection from both the lower side of the support substrate 10 and the upper side of the substrate 28.

As illustrated in FIG. 7B, in an acoustic wave device 130 of the third variation of the first embodiment, the piezoelectric substrate 12 is bonded to the lower surface of the substrate 28 instead of the acoustic wave element 34, and the acoustic wave element 18 is formed on the lower surface of the piezoelectric substrate 12. Other structures are the same as those of the second variation of the first embodiment, and the description is omitted. As described in the third variation of the first embodiment, the acoustic wave element formed under the substrate 28 is not limited to a piezoelectric thin film resonator, and may be a surface acoustic wave element.

As illustrated in FIG. 7C, in an acoustic wave device 140 of the fourth variation of the first embodiment, a recessed portion is formed in a center part of a substrate 28a. Other structures are the same as those of the second variation of the first embodiment, and thus the description is omitted. As described in the fourth variation of the first embodiment, the substrate 28a may have a shape in which a recessed portion is formed in the center part.

The first through fourth variations of the first embodiment describe, as an example, a case where an acoustic wave element is formed under the substrate 28, but an Integrated Passive Device (IPD) or a chip component may be formed instead of the acoustic wave element or in addition to the acoustic wave element.

Second Embodiment

Figure 8:
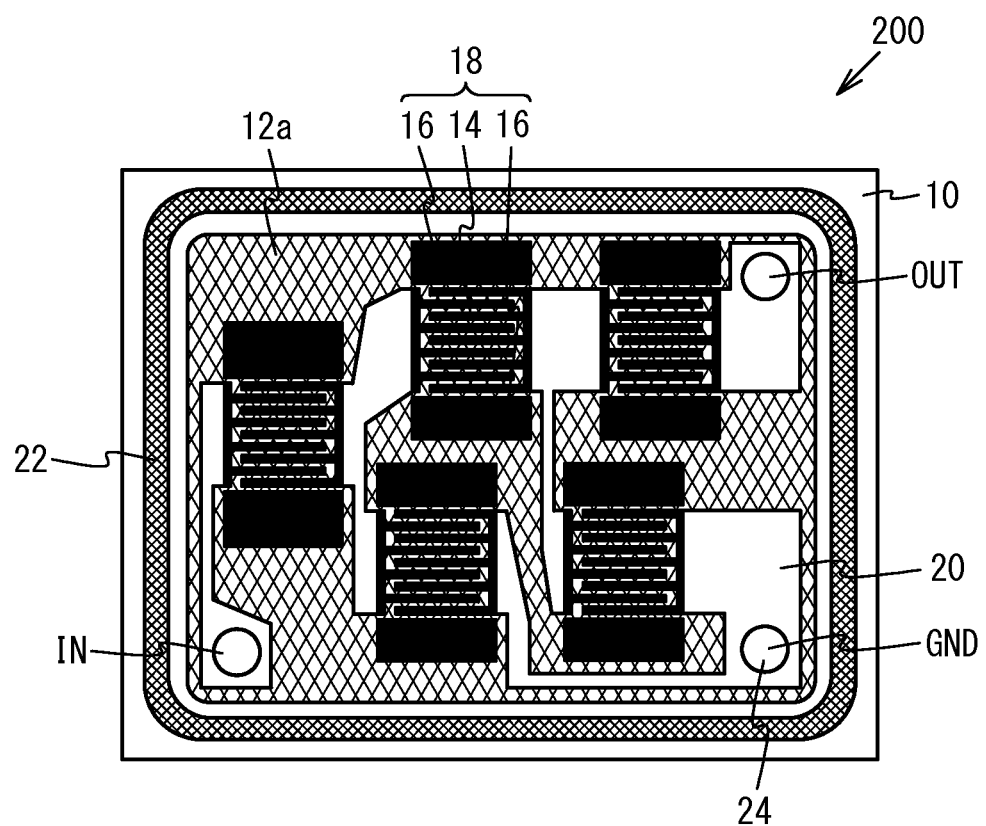
FIG. 8 is a plan view of an acoustic wave device in accordance with a second embodiment.

FIG. 8 is a plan view of an acoustic wave device in accordance with a second embodiment. As illustrated in FIG. 8, in an acoustic wave device 200 of the second embodiment, a piezoelectric substrate 12a remains in the regions where the wiring lines 20 are formed in addition to the regions where the acoustic wave elements 18 are formed. That is to say, the piezoelectric substrate 12 is formed between the protrusion electrodes 24 and the support substrate 10. Other structures are the same as those of the first embodiment, and thus the description is omitted.

In the second embodiment, the piezoelectric substrate 12a is removed in the region where the frame 22 is formed. Thus, the frame 22 is bonded to the support substrate 10 and the substrate 28 between which the difference in linear expansion coefficient is relatively small. Therefore, the stress is reduced, and good reliability is achieved.

Third Embodiment

Figure 9:
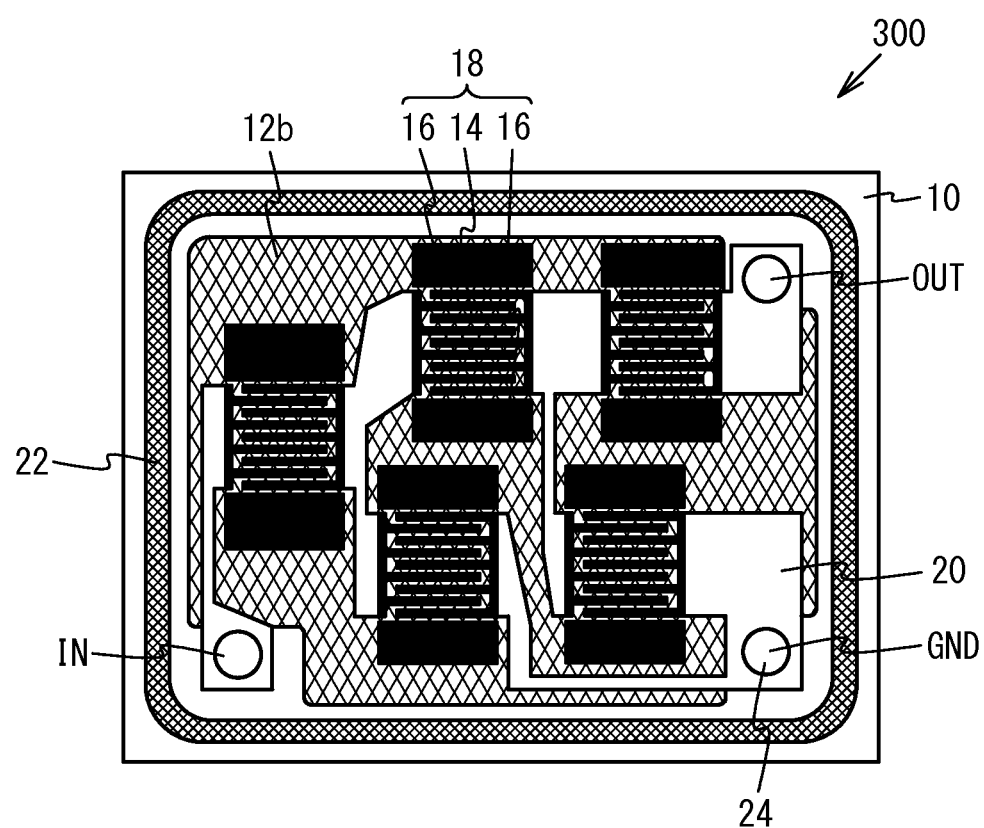
FIG. 9 is a plan view of an acoustic wave device in accordance with a third embodiment.

FIG. 9 is a plan view of an acoustic wave device in accordance with a third embodiment. As illustrated in FIG. 9, in an acoustic wave device 300 of the third embodiment, a piezoelectric substrate 12b remains in the regions where the wiring lines 20 are formed in addition to the regions where the acoustic wave elements 18 are formed, but is removed in the regions where the protrusion electrodes 24 are formed. Other structures are the same as those of the first embodiment, and thus the description is omitted.

In the third embodiment, the piezoelectric substrate 12b is removed in both the region where the frame 22 is formed and the regions where the protrusion electrodes 24 are formed. Thus, the frame 22 and the protrusion electrodes 24 are bonded to the support substrate 10 and the substrate 28 between which the difference in linear expansion coefficient is relatively small, and the stress is thereby reduced.

The piezoelectric substrate is pyroelectrics, and thus electric charge is generated when stress and/or heat is applied. Thus, as the area of the piezoelectric substrate increases, generated electric charges increase, and the acoustic wave element may be thereby damaged. Thus, the area of the piezoelectric substrate is preferably small. Therefore, as illustrated in FIG. 3A of the first embodiment, the piezoelectric substrate 12 preferably remains only in the regions where the acoustic wave elements 18 are formed, and is preferably removed in all other regions.

The first through third embodiments describe, as an example, a case where the support substrate 10 and the substrate 28 are made of the same material, but do not intend to suggest any limitation. The support substrate 10 and the substrate 28 may be made of different materials as long as the support substrate 10, the piezoelectric substrate 12, and the substrate 28 meet the condition that the difference in linear expansion coefficient between the support substrate 10 and the substrate 28 in a first direction in the surface direction of the piezoelectric substrate 12 is less than the difference in linear expansion coefficient between the support substrate 10 and the piezoelectric substrate 12 in the first direction. For example, one of the support substrate 10 and the substrate 28 may be a sapphire substrate and the other may be an alumina ceramic substrate. Alternatively, one of the support substrate 10 and the substrate 28 may be a Si substrate and the other may be a glass substrate such as a Pyrex (registered trademark) glass. In light of the characteristics of the acoustic wave element 18, the support substrate 10 is preferably a sapphire substrate.

Although the embodiments of the present invention have been described in detail, it is to be understood that the various change, substitutions, and alterations could be made hereto without departing from the spirit and scope of the invention.

What is claimed is:

1. An acoustic wave device comprising:
a support substrate;
a piezoelectric substrate bonded to the support substrate;
a first acoustic wave element formed on the piezoelectric substrate;
a frame formed on the support substrate to surround the first acoustic wave element; and
a substrate formed on the frame so that a cavity to which the first acoustic wave element is exposed is formed above the piezoelectric substrate, wherein
a difference in linear expansion coefficient between the support substrate and the substrate in a first direction in a surface direction of the piezoelectric substrate is less than a difference in linear expansion coefficient between the support substrate and the piezoelectric substrate in the first direction, and
the piezoelectric substrate remains in a region where the first acoustic wave element is formed, is not located in a region where the frame is formed, and is not located in at least some regions other than the region where the frame is formed.

2. The acoustic wave device according to claim 1, further comprising:
a protrusion electrode located between the support substrate and the substrate and connecting a wiring line electrically connected to the first acoustic wave element located on the support substrate and a wiring line located on the substrate, wherein
the piezoelectric substrate is not located in a region where the protrusion electrode is formed.

3. The acoustic wave device according to claim 1, wherein the frame contains a material having a linear expansion coefficient of which a difference from a linear expansion coefficient of the support substrate in the first direction is less than the difference in linear expansion coefficient between the support substrate and the piezoelectric substrate in the first direction.

4. The acoustic wave device according to claim 1, wherein the first direction is a direction in which the difference in linear expansion coefficient between the support substrate and the piezoelectric substrate is largest.

5. The acoustic wave device according to claim 1, wherein the support substrate and the substrate are made of a same material.

6. The acoustic wave device according to claim 1, wherein the support substrate is a sapphire substrate.

7. The acoustic wave device according to claim 1, wherein the piezoelectric substrate is a lithium tantalate substrate or a lithium niobate substrate.

8. The acoustic wave device according to claim 1, wherein
the piezoelectric substrate is a rotated Y-cut X-propagation lithium tantalate substrate or a rotated Y-cut X-propagation lithium niobate substrate, and
the difference in linear expansion coefficient between the support substrate and the substrate in an X-axis orientation of the rotated Y-cut X-propagation lithium tantalate substrate or the rotated Y-cut X-propagation lithium niobate substrate is less than the difference in linear expansion coefficient between the support substrate and the piezoelectric substrate in the X-axis orientation.

9. The acoustic wave device according to claim 1, further comprising:
a second acoustic wave element located on an under surface of the substrate and exposed to the cavity.

10. The acoustic wave device according to claim 1, wherein
the piezoelectric substrate is not located in the region where the frame is formed, and is not located in at least some regions inside the frame.

11. The acoustic wave device according to claim 1, wherein
the piezoelectric substrate is not located in the region where the frame is formed, and is not located in a region outside the frame.

12. The acoustic wave device according to claim 1, wherein
the piezoelectric substrate is not located in the region where the frame is formed, not located in at least some regions inside the frame, and is not located in a region outside the frame.

13. The acoustic wave device according to claim 1, further comprising:
a via wiring pierced through the supporting substrate in a region where the piezoelectric substrate is not located, the via wiring being electrically connected to the first acoustic wave element.

14. An acoustic wave device comprising:
a support substrate;
a piezoelectric substrate bonded to the support substrate;
a first acoustic wave element formed on the piezoelectric substrate;
a frame formed on the support substrate to surround the first acoustic wave element;
a substrate formed on the frame so that a cavity to which the first acoustic wave element is exposed is formed above the piezoelectric substrate, and a protrusion electrode located between the support substrate and the substrate and connecting a wiring line electrically connected to the first acoustic wave element located on the support substrate and a wiring line located on the substrate, wherein a difference in linear expansion coefficient between the support substrate and the substrate in a first direction in a surface direction of the piezoelectric substrate is less than a difference in linear expansion coefficient between the support substrate and the piezoelectric substrate in the first direction, and the piezoelectric substrate remains in a region where the first acoustic wave element is formed, is not located in a region where the frame is formed, and is not located in a region where the protrusion electrode is formed.

* * * * *